United States Patent [19]

Hoshino et al.

[11] Patent Number: 4,497,529
[45] Date of Patent: Feb. 5, 1985

[54] INTEGRATED CIRCUIT SOCKET HAVING AN IMPROVED COVER

[75] Inventors: Mitsuo Hoshino, Atsugi; Osamu Fukushima, Kawasaki; Toshio Kakuta, Higashiosaka, all of Japan

[73] Assignees: Sony Corporation, Tokyo; Hosiden Electronics Co., Ltd., Osaka, both of Japan

[21] Appl. No.: 443,795

[22] Filed: Nov. 22, 1982

[30] Foreign Application Priority Data

Dec. 2, 1981 [JP] Japan ............................ 56-180276[U]

[51] Int. Cl.$^3$ .............................................. H01R 13/62
[52] U.S. Cl. ................................ 339/75 M; 339/176 M
[58] Field of Search .......... 339/17 CF, 75 M, 75 MP, 339/176 MP, 176 M

[56] References Cited

U.S. PATENT DOCUMENTS

| | | | |
|---|---|---|---|
| 4,063,791 | 12/1977 | Cutchaw | 339/75 MP |
| 4,144,648 | 3/1979 | Grovender | 339/75 M |
| 4,166,665 | 9/1979 | Cutchaw | 339/75 MP |
| 4,390,220 | 6/1983 | Benasutti | 339/75 M |
| 4,456,318 | 6/1984 | Shibata et al. | 339/17 CF |

Primary Examiner—John McQuade
Assistant Examiner—Gary F. Paumen
Attorney, Agent, or Firm—Pollock, Vande Sande and Priddy

[57] ABSTRACT

A connector for making electrical connections to the terminals of an integrated circuit comprises a plurality of ribs formed integrally with a rectangular-prism-shaped base at regular intervals in its lengthwise direction to extend across the top surface of the base. Contacts are each housed and retained between adjacent ones of the ribs and conductors for connection are respectively placed on the contacts. By assembling a cover of an insulating material with the base to cover its top surface, a slider made of metal and attached to the cover is slightly moved back and forth for engagement with the base, locking the cover with the base.

15 Claims, 23 Drawing Figures

INTEGRATED CIRCUIT SOCKET HAVING AN IMPROVED COVER

BACKGROUND OF THE INVENTION

The present invention relates to a connector for connection with a plurality of terminals projecting in parallel from a miniaturized electrical part, such as a hybrid integrated circuit.

Heretofore, no connectors have been proposed for connection with terminals of a hybrid integrated circuit. What is called a multiconnector, employed in the past, is of the type wherein a plate-like insertion piece one or both sides of which have arranged thereon relatively many terminals along one marginal edge, such as a printed-circuit board, is inserted into the body of the connector for resilient contact with the corresponding contacts held in the connector body. In hybrid integrated circuits or semiconductor integrated circuits, however, a plurality of terminals are attached to the circuit board to project out therefrom and these terminals are thin and closely spaced; therefore, it is difficult to insert such terminals one by one into insertion holes of the connector. For this reason, no connector is employed for connection with the integrated circuit terminals. Usually, the terminals are directly connected by bonding to the printed circuits on the circuit board. Incidentally, there is utilized a connector of the type connecting to the printed-circuit board a package having housed therein an integrated circuit but, in this case, the package used differs depending on the type of the integrated circuit.

SUMMARY OF THE INVENTION

It is an object of the present invention to provide a connector which can be connected relatively easily to a plurality of terminals projecting out of a miniature electrical part, such as an integrated circuit.

Another object of the present invention is to provide a connector which can be made ultra-miniature and thin and permits the connection thereto of a large number of conductors of an external circuit.

Yet another object of the present invention is to provide a connector which, when mounted on a printed-circuit board or the like, does not require the application of an extra force to the circuit board for connection with or disconnection from conductors of an external circuit.

According to the present invention, a plurality of ribs are formed integrally with a substantially rectangular-prism-shaped base at equal intervals in its lengthwise direction to extend on its top surface in a direction perpendicular to the lengthwise direction. The ribs define between adjacent ones of them contact receiving portions, in which contacts are respectively disposed and retained. For example, resilient conductors are molded integrally with the base in the corresponding contact receiving portions, and one of the projecting end portions of each conductor is bent into the contact receiving portion to form one contact and the other projecting end is used as a terminal. In this way, closely spaced contacts can be held on the base. A cover of an insulating material is detachably mounted on the top surface of the base to press connection conductors of an external circuit against the contacts. A slider is attached to the cover in a manner to be movable in its longitudinal direction and, after mounting the cover on the base, by sliding the slider relative to the cover to engage engaging pieces at one end of the slider with a projection projecting out from one end of the base and to retain the other end of the slider to the other end face of the base, the cover can be fixed to the base. In this case, a coiled spring is interposed between the slider and the cover. By urging the assembly of the cover and the slider against the base, the slider is moved against the biasing force of the coiled spring and then moved back by the biasing force into engagement with the base, and this engagement is retained by the biasing force of the coiled spring. When pressing the cover against the base, an insertion piece projecting out of one of the base and the cover is fitted into a guide hole made in the other, positioning the cover and the base relative to each other. Furthermore, similar grooves are formed in the intermediate portions of the ribs of the base for receiving a hold-down portion of the cover, ensuring that the connection conductors of the external circuit are pressed against the contacts under a sufficient pressure. Moreover, a lock mechanism can also be provided for locking the slider to the base with the cover mounted thereon. Only when unlocking the lock mechanism, the slider can move against the biasing force of the coiled spring and the slider and the cover can be removed from the base.

DESCRIPTION OF THE PREFERRED EMBODIMENTS

Figure 3:
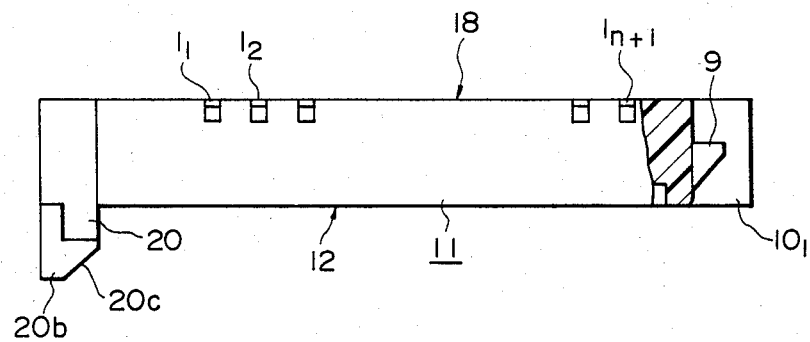
FIG. 3 is its rear view.
Figure 4:
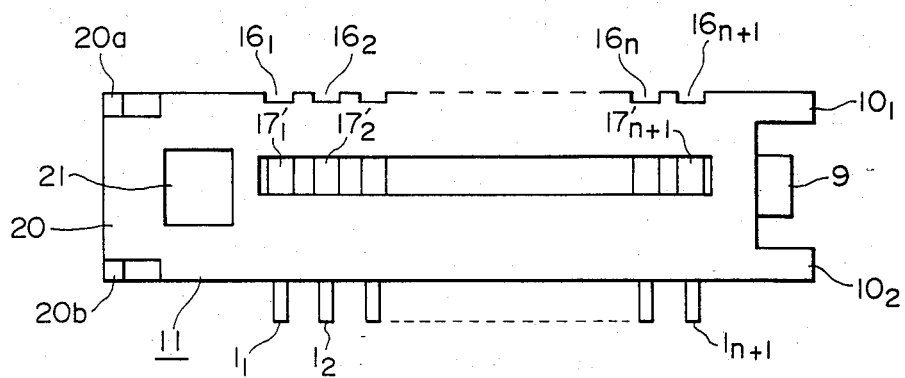
FIG. 4 is its bottom view.
Figure 5:
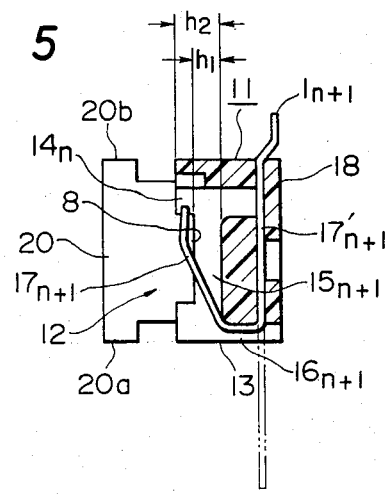
FIG. 5 is a cross-sectional view taken on the line 5—5 in FIG. 2.
Figure 7:
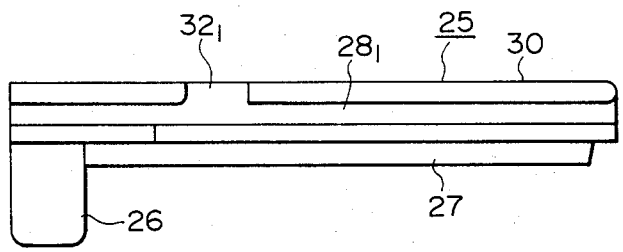
FIG. 7 is a front view of a cover 25 used in FIG. 6.

FIGS. 1 to 5 show a base structure of an embodiment of the connector of the present invention. A base 11 is substantially a rectangular prism and formed of an insulating material, such as synthetic resin. On the top surface 12 of the base 11, ribs $14_1$ to $14_n$ extending in its widthwise direction are arranged in its lengthwise direction at regular intervals. The ribs $14_1$ to $14_n$ define contact receiving portions $15_1$ to $15_{n+1}$ between adjacent ones of them. In the contact receiving portions $15_1$ to $15_{n+1}$ strip contacts $17_1$ to $17_{n+1}$ formed of a resilient conductive material are disposed and retained to the base 11. For instance, as shown in FIG. 5, resilient strip conductors $17'_1$ to $17'_{n+1}$ (only $17'_{n+1}$ is shown) are molded integrally with the base 11 at the positions corresponding to the contact receiving portions $15_1$ to $15_{n+1}$, with opposite ends projecting out from the base 11 and, as indicated by the broken lines, one of the projecting end portions of the resilient strip conductors $17'_1$ to $17'_{n+1}$ are bent to conform to the contact receiving portions $15_1$–$15_{n+1}$, forming the contacts $17_1$ to $17_{n+1}$. In this case, the contact receiving portions $15_1$ to $15_{n+1}$ are formed to extend at one end to one marginal edge of the top surface 12 of the base 11 thence extend down its one side 13 adjoining the top surface 12, forming guide grooves $16_1$ to $16_{n+1}$. The resilient strip conductors $17'_1$ to $17'_{n+1}$ are bent into contact with the bottoms of the guide grooves $16_1$ to $16_{n+1}$ and held aslant to the bottoms of the contact receiving portions $15_1$ to $15_{n+1}$. It is preferred that the height $h_2$ of the rib 14 be larger than the height $h_1$ of the contact 17 from the bottom of the contact receiving portion 15. To facilitate bending of the resilient strip conductors $17'_1$ to $17'_{n+1}$ through using a jig, the guide grooves $16_1$ to $16_{n+1}$ are formed to extend down to the bottom 18 of the base 11. The other end portions of the contact receiving portions $15_1$ to $15_{n+1}$ are curved towards the bottom 18 of the base 11, and the bottoms of the contact receiving portions $15_1$ to $15_{n+1}$ and the guide grooves $16_1$ to $16_{n+1}$ can be used as a form die for bending the resilient strip conductors $17'_1$ to $17'_{n+1}$. The other projecting portions of the resilient conductor strips $17'_1$ to $17'_{n+1}$ are used as terminals $1_1$ to $1_{n+1}$.

Figure 1:
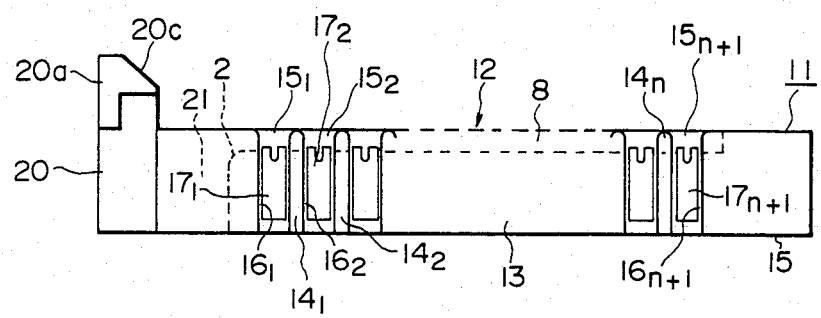
FIG. 1 is a front view showing a base structure of a connector embodying the present invention.
Figure 2:
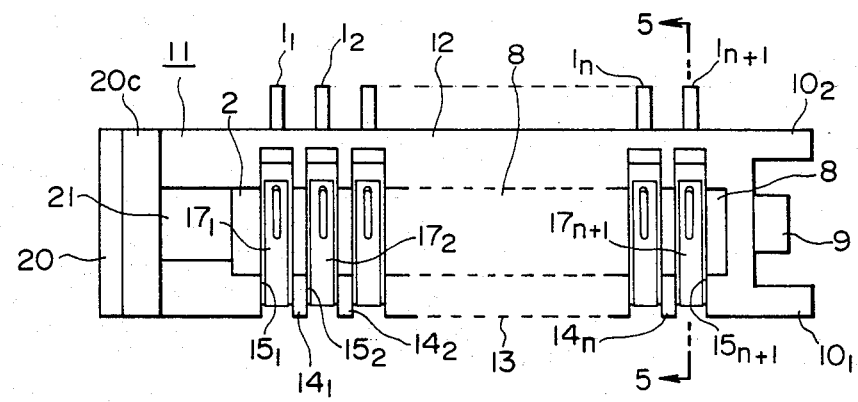
FIG. 2 is its plan view.

A substantially plate-like cover 25 formed of an insulating material is detachably mounted on the top surface 12 of the base 11. As shown in FIGS. 6 to 9, the underside of the cover 25 has formed integrally therewith a protruding hold-down portion 27 extending in its lengthwise direction at an intermediate position in its widthwise direction. In order that the hold-down portion 27 may be fitted into the base 11, a groove 8 is cut in top surface 12 of the base as shown in FIGS. 1, 2 and 5; namely, the intermediate portions of the ribs $14_1$ to $14_n$ are reduced in height as compared with the other portions thereof to thereby define the groove 8. Positioning means is provided for snugly fitting the hold-down portion 27 into the groove 8. For instance, an insertion piece 26 is formed integrally with the hold-down portion 27 at one end thereof. For receiving the insertion piece 26, a guide hole 21 is made in the base 11 at one end of the groove 8 in a manner to communicate therewith as shown in FIGS. 1, 2 and 4. To facilitate the insertion of the insertion piece 26 into the guide hole 21, its edge on the side of the groove 8 is rounded as indicated by 2 in FIG. 1.

The cover 25 has mounted thereon a slider 40 (shown in FIGS. 13-17) in a manner to be movable lengthwise thereof. When the cover 25 is fitted into the base 11, the slider 40 is engaged by engaging means with the base 11 to retain the cover 25 in engagement with the base 11. By sliding the slider 40, the cover 25 can be disengaged from the base 11.

Figure 6:
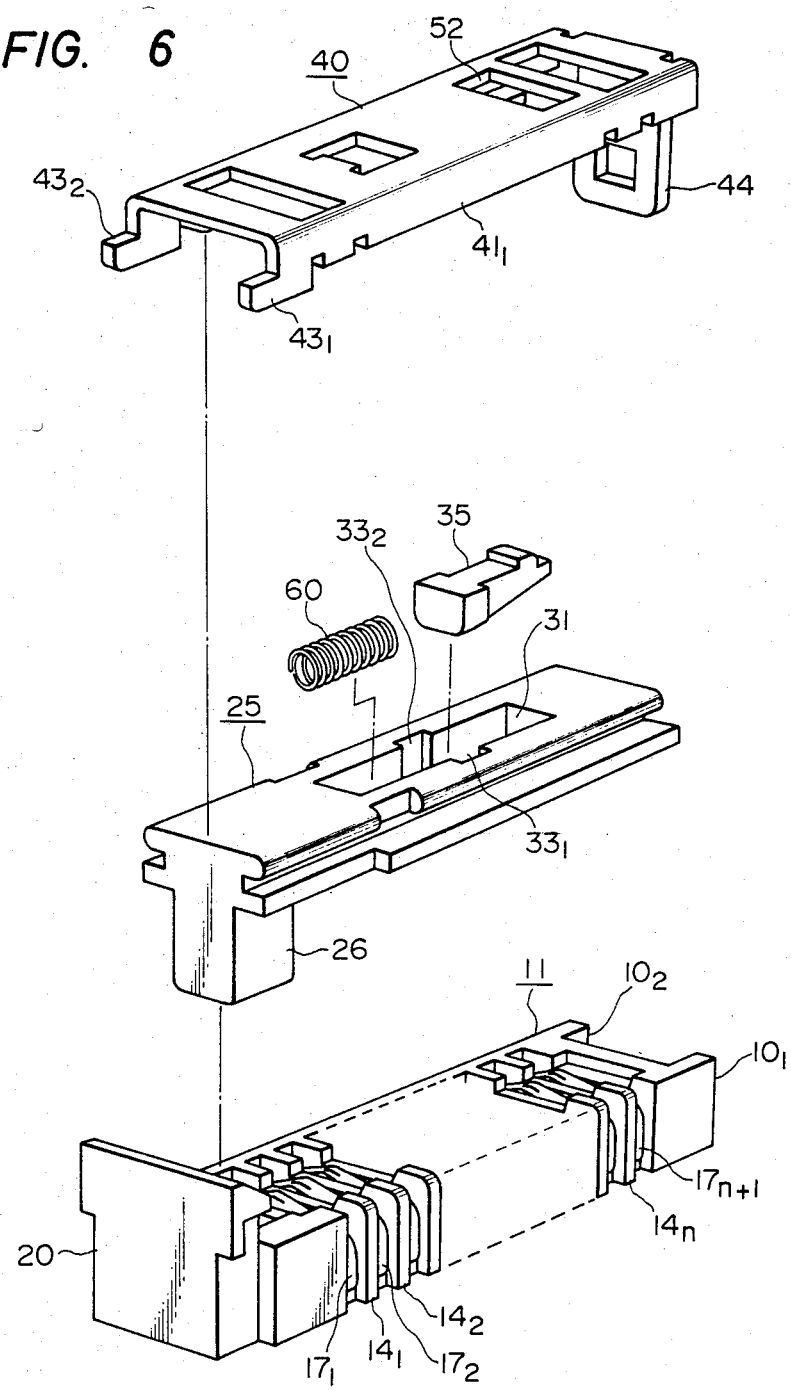
FIG. 6 is an exploded view illustrating an embodiment of the connector of the present invention.
Figure 8:
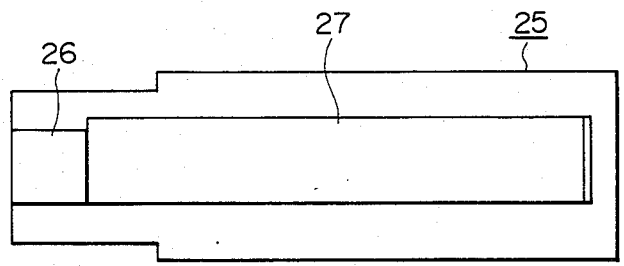
FIG. 8 is a bottom view of the connector shown in FIG. 6.
Figure 9:
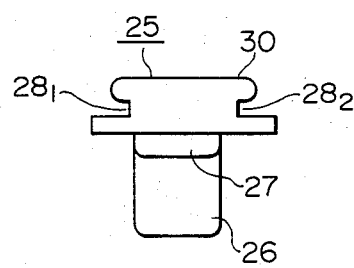
FIG. 9 is a right side view of the connector of FIG. 6.
Figure 10:
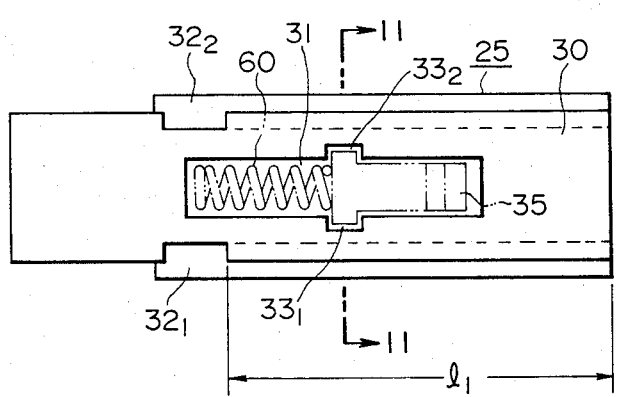
FIG. 10 is a plan view of the connector of FIG. 6.
Figure 13:
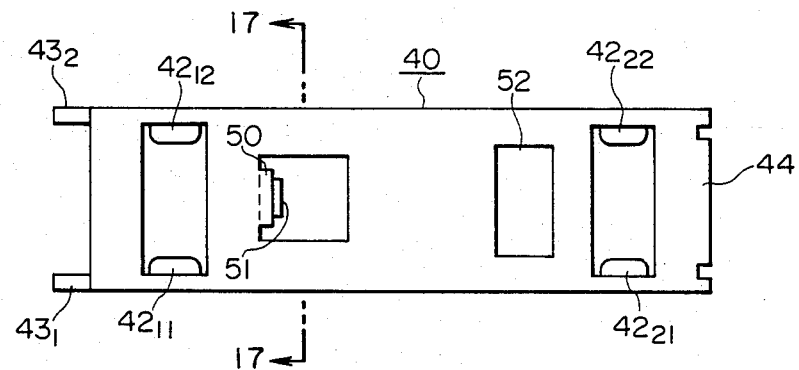
FIG. 13 is a plan view of a slider 40 used in the connector of FIG. 6.
Figure 17:
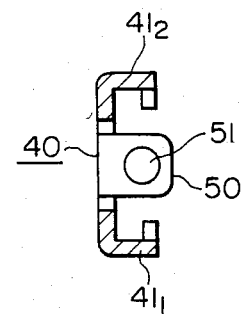
FIG. 17 is a cross-sectional view taken on the line 17—17 in FIG. 13.
Figure 20:
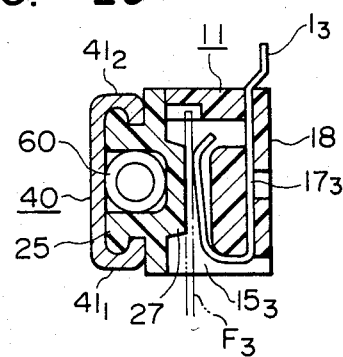
FIG. 20 is a cross-sectional view taken on the line 20—20 in FIG. 19.

The slider 40 is formed by a metal plate covering the top surface of the cover 25 on the opposite side from the hold-down portion 27 and, as shown in FIGS. 6, 13 and 17, both marginal portions of the metal plate in its longitudinal direction are bent in the same direction at right angles to the plate surface to form slide pieces $41_1$ and $41_2$. Furthermore, marginal portions of the slide pieces $41_1$ and $41_2$ are partly bent inwardly in the vicinity of their both end portions, forming pawls $42_{11}$ to $42_{22}$. The slide pieces $41_1$ and $41_2$ hold therebetween the cover 25 as depicted in FIG. 20 and the pawls $42_{11}$ to $42_{22}$ are engaged with guide grooves $28_1$ and $28_2$ (FIGS. 7 and 9) cut in both sides of the cover 25. In both sides of the cover 25 recesses $32_1$ and $32_2$ are formed to extend between the top surface 30 of the cover 25 and the guide grooves $28_1$ and $28_2$ as shown in FIG. 10. The distance $l_1$ between the recesses $32_1$ and $32_2$ and one end of the cover 25 is selected slightly smaller than the distance $l_2$ between the pawls $42_{11}$, $42_{12}$ and $42_{21}$, $42_{22}$. By passing the pawls $42_{11}$ and $42_{12}$ of the slider 40 through the recesses $32_1$ and $32_2$ and sliding the cover 25 and the slider 40 relative to each other, the pawls $42_{11}$ to $42_{22}$ are brought into engagement with the guide grooves $28_1$ and $28_2$. On the top surface 12 of the base 11 at the side of the guide hole 21 an upright projection 20 is formed integrally therewith as shown in FIGS. 1 and 2, and both marginal portions of the projection 20 are cut off on the side of the base 11, forming lugs $20a$ and $20b$ (FIG. 5). A tapered projection 9 is formed integrally with the base 11 on the end face centrally thereof on the opposite side from the projection 20 as shown in FIGS. 2 to 4. On both sides of the tapered projection 9 lugs $10_1$ and $10_2$ are formed integrally with the base 11.

Figure 14:
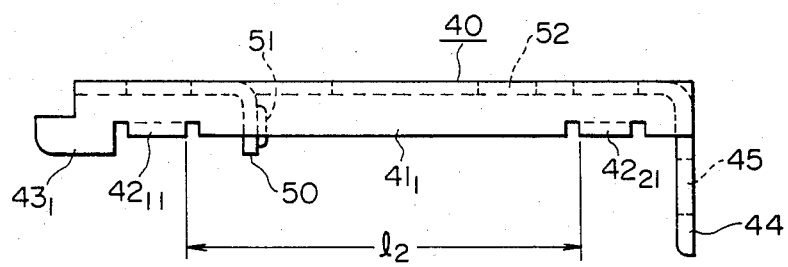
FIG. 14 is a front view of the slider 40 of FIG. 13.
Figure 15:
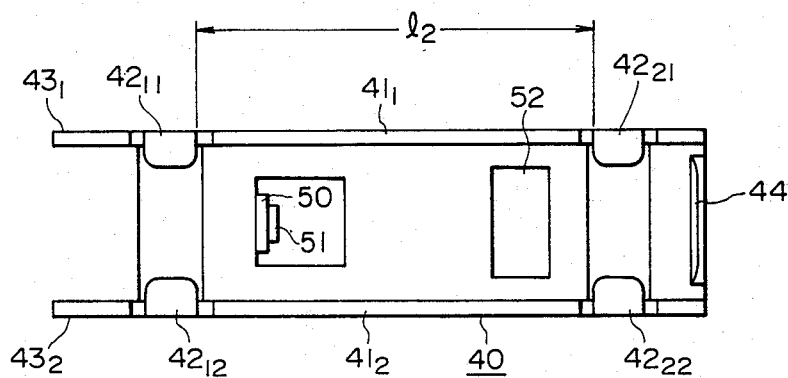
FIG. 15 is a bottom view of the slider 40 of FIG. 13.
Figure 16:
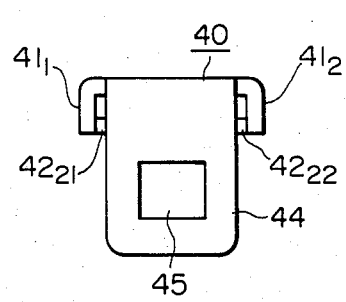
FIG. 16 is a right side view of the slider 40 of FIG. 13.

On the other hand, as shown in FIGS. 6 and 13, engaging pieces $43_1$ and $43_2$ are formed to extend from the slide pieces $41_1$ and $41_2$ lengthwise thereof at the end of the slider 40 on the side of the insertion piece 26 for engagement with the lugs $20a$ and $20b$ on both sides of the projection 20 of the base 11. The projecting end face of the projection 20 slopes towards the top surface 12 of the base 11 as indicated by $20c$. The other end of the slider 40 is bent down perpendicularly to form an end piece 44 as shown in FIGS. 14 and 16. An opening 45 is made in the end piece 44 centrally thereof for engagement with the projection 9 of the base 11. The width of the end piece 44 is selected so that it may be guided between the projecting pieces $10_1$ and $10_2$.

Figure 11:
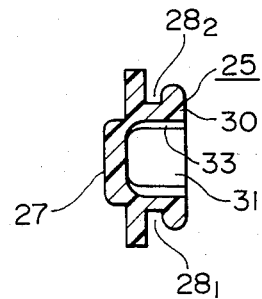
FIG. 11 is a cross-sectional view taken on the line 11—11 in FIG. 10.
Figure 12:
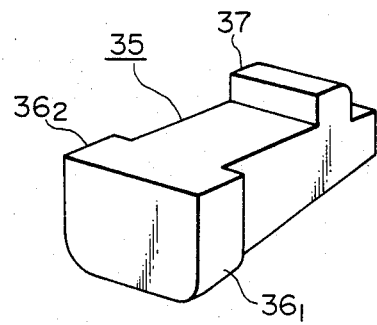
FIG. 12 is an enlarged perspective view of a lock piece 35.
Figure 18:
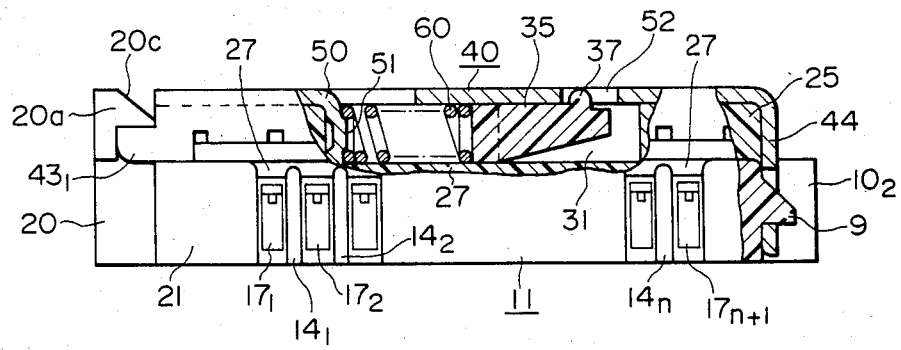
FIG. 18 is a front view, partly in section, showing the assembly of the connector shown in FIG. 6.
Figure 19:
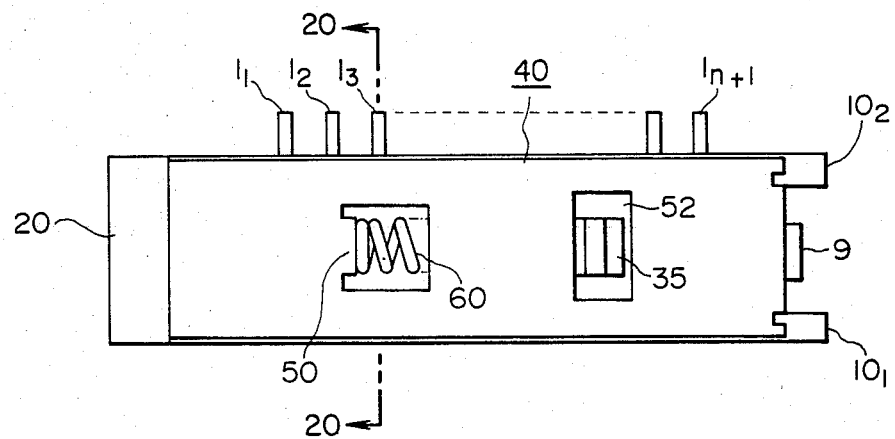
FIG. 19 is a plan view of the assembly shown in FIG. 18.

The slider 40 is biased to keep the end piece 44 in contact with the end face of the cover 25 on the opposite side from the insertion piece 26 at all times. By the biasing force of the slider 40 the cover 25, when assembled with the base 11, is held in engagement with the latter. Furthermore, lock means is provided for locking the cover 25 with the base 11. To this end, for example, as shown in FIGS. 6, 10 and 11, a spring housing chamber 31 is provided in the top surface of the cover 25 to extend in its lengthwise direction on the opposite side from the hold-down portion 27. The central portion of the spring housing chamber 31 in its longitudinal direction is cut out on both sides to provide engaging recesses $33_1$ and $33_2$. As depicted in FIGS. 6, 10 and 18, a lock piece 35 is placed in engagement with the engaging recesses $33_1$ and $33_2$ in the spring housing chamber 31 on the side opposite from the insertion piece 26. The lock piece 35 has, as shown on an enlarged scale in FIG. 12, engaging projections $36_1$ and $36_2$ formed on both sides of its one end for insertion into the engaging recesses $33_1$ and $33_2$, respectively, and a lug 37 formed at the other end to stand upright. The bottom of the lock piece 35 is tapered towards the lug 37 to reduce the thickness. A coiled spring 60 is disposed in the remaining space of the spring housing chamber 31.

On the other hand, the slider 40 has a downwardly projecting lug 50 at the position opposite to the spring 60 as shown in FIGS. 13, 14 and 18. The lug 50 is inserted into the spring housing chamber 31. The spring 60 is interposed between the lug 50 and the lock piece 35. Since the engaging projections $36_1$, $36_2$ of the lock piece 35 are engaged with the engaging processes $33_1$, $33_2$ of the cover 25, the cover 25 is biased by the spring 60 to the right via the engaging recesses $33_1$, $33_2$ and the slider 40 to the left via the lug 50 in FIG. 18, urging the end piece 44 into contact with the end face of the cover 25. At this time, the lug 37 lies in a lock hole 52 made in the slider 40, so that movement of the slider 40 against the biasing force of the spring 60 in such a direction as to pull the end piece 44 away from the end face, i.e. to the right in FIG. 18, is prevented by the engagement of the lug 37 with the lock hole 52; namely the cover 25 is locked with the base 11. The cover 25 can be unlocked from the base 11 by pressing the end portion of the lock piece 35 towards the bottom of the spring housing chamber 31 to disengage the lug 37 from the lock hole 52. Incidentally, the lug 50 has a small projection 51 for retaining one end of the coiled spring 60. The widths of the engaging recesses $33_1$, $33_2$ of the cover 25 are made slightly larger than the widths of the engaging projections $36_1$, $36_2$ so that when the lock piece 35 is placed in an unlocked state the engaging projections $36_1$, $36_2$ can tilt within the engaging recesses $33_1$, $33_2$.

Figure 22:
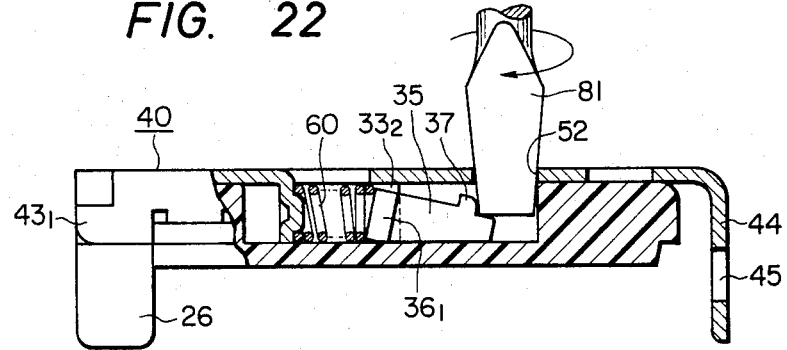
FIG. 22 is a diagram showing an unlocked state of the connector for a connecting operation.
Figure 21:
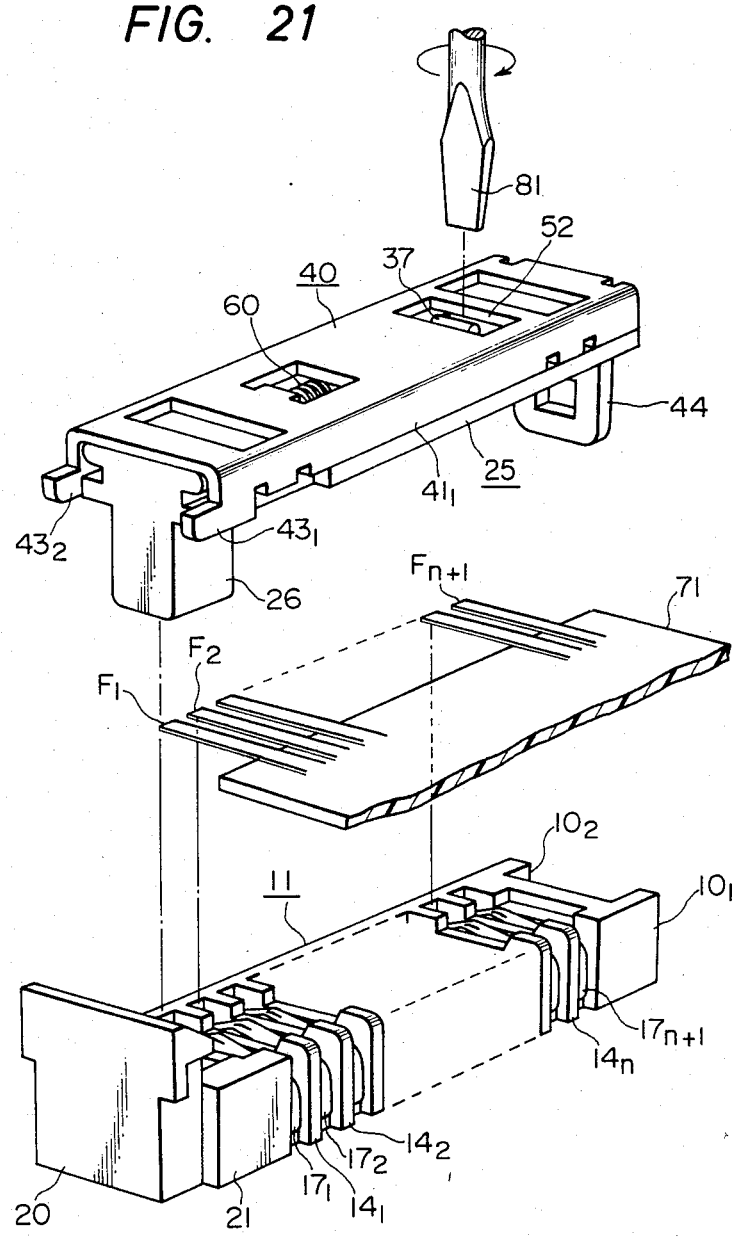
FIG. 21 is a perspective view explanatory of the connection of the connector of the present invention with conductors connected thereto.

To the above-described connector of the present invention conductors for connection can be connected in the following manner. For example, in the case of connecting external connection terminals $F_1$ to $F_{n+1}$ of a hybrid IC (hybrid integrated circuit) 71 as shown in FIGS. 20 and 21, the external connection terminals $F_1$ to $F_{n+1}$ project out in parallel from one side of the hybrid IC substrate and the pitch of arrangement of the terminals is the same as the pitch of the contacts $17_1$ to $17_{n+1}$ of the connector. The external connection terminals $F_1$ to $F_{n+1}$ are respectively placed in the contact receiving portions $15_1$ to $15_{n+1}$ so that they may overlie the contacts $17_1$ to $17_{n+1}$ respectively corresponding thereto on the top surface of the base 11. In this case, positioning of the external connection terminals $F_1$ to $F_{n+1}$ can easily be accomplished by abutting their tips against the walls of the contact receiving portions $15_1$ to $15_{n+1}$ on the side opposite from the side 13 of the base 11 as seen in FIG. 5. On the other hand, as shown in FIG. 21, the tip of a small screw-driver 81, for instance, is inserted into the lock hole 52 with the width of the screw-driver 81 being held perpendicular to the slide direction of the slider 40 and the lock piece 52 is urged against the bottom of the spring housing chamber 31 to bring thereinto the lug 37 from the lock hole 52, unlocking the cover 25 and the slider 40 from each other. Then, by turning the screwdriver 81, the lug 37 is further pushed inwardly into the spring housing chamber 31, allowing relative sliding movement of the cover 25 and the slider 40 against the biasing force of the spring 60. As a result, the tips of the engaging pieces $43_1$, $43_2$ of the slider 40 are brought in alignment with the outer end of the insertion piece 26 (see FIG. 22). After this, the insertion piece 26 of the cover 25 is inserted into the guide hole 21 of the base 11, the end piece 44 of the slider 40 is positioned between the lugs $10_1$ and $10_2$ and the slider 40 is pressed against the base 11 to press fit the hold-down portion 27 of the former into the groove 8 of the latter, thereby urging the external connection terminals $F_1$ to $F_{n+1}$ against the contacts $17_1$ to $17_{n+1}$ by the hold-down portion 27. Then, the screw-driver 81 is turned to its initial position and removed from the lock hole 52 and, as a result of this, the slider 40 slides by virtue of the biasing force of the spring 60 to bring the engaging pieces $43_1$ and $43_2$ into engagement with the lugs 20a and 20b and the projection into engagement with the opening 45 of the end piece 44.

Thus, the external connection terminals $F_1$ to $F_{n+1}$ are respectively held in contact with the contacts $17_1$ to $17_{n+1}$ with a sufficient contact pressure. The spring 60 biases the slider 40 to maintain the engagement of the engaging pieces $43_1$ and $43_2$ with the lugs 20a and 20b and the engagement of the projection 9 with the opening 45, and the lug 37 is held in the lock hole 52, thereby locking the cover 25 with the base 11. As seen from FIG. 22, in an unlocked state of the lock piece 35, one end face thereof abutting the spring is aslant; therefore, the lock piece 35 receives a stronger biasing force at lower position, producing a biasing force urging the lug 37 upwardly.

When it is desired to disassemble the cover 25 from the base 11, the tapered end portion of the lock piece 35 is pressed against the bottom of the spring housing chamber 31, for example, by the tip of the screw-driver 81 while turning it. By this, the lug 37 is disengaged from the lock hole 52 to unlock the cover 25 and the slider 40 from each other, and the slider 40 is slid on the base 11 to the right in FIG. 18 against the biasing force of the spring 60 to disengage the engaging pieces $43_1$ and $43_2$ from the lugs 20a and 20b and the projection 9 from the opening 45, permitting removal of the cover 25 from the base 11.

Figure 23:
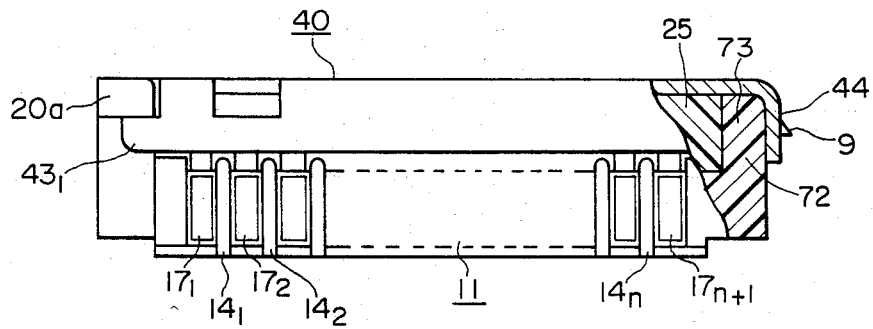
FIG. 23 is a front view corresponding to FIG. 18, partly in section, illustrating another embodiment of the connector of the present invention.

While in the foregoing the insertion piece 26 formed integrally with the cover 25 is inserted into the guide hole 21 of the base 11 for relative positioning of the base 11 and the cover 25, it is also possible to employ such an arrangement as shown in FIG. 23 in which an insertion piece 72 is formed integrally with the base 11 on the opposite side from the lugs 20a and 20b to project out from the top surface 12 of the base 11 and a guide recess 73 is made between the cover 25 and the end piece 44 of the slider 40 for receiving the insertion piece 72.

In the two embodiments of the present invention described in the foregoing, it is also possible to omit the lock piece 35 and remove the portion of the spring housing chamber 31 in which the lock piece 35 is housed. That is to say, the lock mechanism may be left out. In this case, for instance, in FIG. 21, by inserting the insertion piece 26 into the guide hole 21, placing the engaging pieces $43_1$ and $43_2$ on the slope 20c of the projection 20, disposing the end piece 44 between the lugs $10_1$ and $10_2$ and pressing the slider 40 towards the base 11, the slider 40 is moved against the biasing force of the spring 60 and then returned to bring the engaging pieces $43_1$ and $43_2$ into engagement with the lugs 20a and 20b and the projection 9 into engagement with the opening 45.

As has been described in the foregoing, according to the connector of the present invention, by placing conductors to be connected on the contacts of the base 11 and pressing the cover 25 against the base 11 from above, the slider 40 is slid back and forth while the assembly of the cover 25 and the slider 40 are brought into engagement with the base 11; hence, the conductors can easily be connected to the contacts. In addition, during the connecting operation, no force is applied to the conductors $F_1$ to $F_{n+1}$ in their extending direction, so that there is no fear of impairing their connection to the associated printed-circuit board, for example. The connector of the present invention can be miniaturized by fixing the contacts to the base 11 by means of molding, so that it can easily be connected with a number of thin terminals projecting in parallel from an integrated circuit board or the like. By the way, it is impossible in the prior art to insert thin terminals into holes of a connector for resilient contact with its contacts under a sufficient pressure because the terminals would easily be bent. In the case of the contacts being retained by molding, when other connection lines are soldered to the contact terminals $1_1$ to $1_{n+1}$, there is no possibility of soldering flux entering into the base 11, so that the contacts $17_1$ to $17_{n+1}$ are not contaminated by the soldering flux. Furthermore, the presence of the ribs $14_1$ to $14_n$ allows ease in disposing the conductors $F_1$ to $F_{n+1}$ one by one in the contact receiving chambers $15_1$ to $15_{n+1}$ and ensures that when the cover 25 is urged against the base 11, none of the conductors $F_1$ to $F_{n+1}$ are bent into contact with adjacent ones of said conductors.

A suitable selection of the relationship between the depth of the groove 8 and the depths of the contact receiving portions $15_1$ to $15_{n+1}$, as described previously, ensures that even if the connecting operation is repeatedly carried out, the resiliency of the contacts $17_1$ to $17_{n+1}$ can sufficiently be maintained, providing excellent contact at all times. By the provision of the insertion piece 26 or guide 72 and the guide hole 21 or 73, the cover 25 can easily be assembled with the base 11 in correct positional relation thereto. If the slider 40 is made of metal, the cover 25 is mechanically reinforced and can be made thin, permitting further miniaturization of the connector in its entirety. Besides, in the case where the number of contacts $17_1$ to $17_{n+1}$ is increased, the cover 25 is subject to a force of deflection by the sum total of the resiliency of the contacts when assembled with the base 11, but the slider 40 made of metal reduces the deflection, assuring good contact between the contacts and the conductors. Moreover, since the cover 25 can be removed from the base 11 by moving the slider 40 and the cover 25 relative to each other against the biasing force of the spring 60, the conductors connected are not exposed directly to any large force, and hence are not ever bent. In addition, since connection between contacts of the connector according to the present invention and terminal leads of a device to be connected is achieved in a snap-in manner, there is no fear of applying an undesirable force, when connection is performed, to a circuit board on which the connector is mounted. Furthermore, if the number of contact is selected large, the connector can be used with various integrated circuits having different numbers of external connection terminals.

It will be apparent that many modifications and variations may be effected without departing from the scope of the novel concepts of the present invention.

What is claimed is:

1. A connector comprising:
   a substantially rectangular-prism-like base made of an insulating material;
   a plurality of ribs formed integrally with the base at regular intervals in its lengthwise direction to extend on its top surface in a direction perpendicular to the lengthwise direction, defining a plurality of contact receiving portions located respectively between adjacent ones of said ribs;
   a plurality of contacts respectively disposed in the contact receiving portions and retained to the base;
   an elongated cover made of an insulating material for covering the base so as to hold the conductors of an external circuit in engagement with said contacts;
   a slider mounted on the cover in a manner to be slidable relative to said cover in the lengthwise direction of said cover;
   retaining means for engaging the slider and the base with each other while fixing the cover to the base with the conductors of the external circuit resiliently pressed against the contacts by the cover; and
   biasing means interposed between the cover and the slider, said biasing means producing a force in the lengthwise direction of said cover and slider operative to exert a bias on said retaining means which holds the cover and the slider in engagement with the base.

2. A connector according to claim 1 wherein said biasing means comprises a spring housing chamber formed in the cover in opposing relation to the slider; one portion of the slider extending into the spring housing chamber; a coiled spring located in said chamber, said spring being retained at one end by said extending portion of said slider and having its axis parallel to the direction of sliding movement of the slider; the slider and the cover being biased by the coiled spring relative to each other.

3. A connector according to claim 2 wherein the slider is formed by a plate of metal; said one portion of the slider being raised to form a lug for insertion into the spring housing chamber, the lug being used as an extension of the slider.

4. A connector according to claim 1 wherein positioning means is provided between one portion of the cover and one end portion of the base for engaging the cover and the base with each other to position them when they are assembled together.

5. A connector according to claim 4 wherein the positioning means comprises an insertion piece formed integrally with the cover at one end of its bottom surface for contact with the base, and a guide hole in the top surface of the base at one end thereof for receiving the insertion piece.

6. A connector according to claim 4 wherein the positioning means comprises an insertion piece formed integrally with the base at one end of the top surface thereof, and a guide formed between one end of the cover and the corresponding end of the slider for receiving the insertion piece.

7. A connector according to claim 1 wherein the slider is formed by a plate of metal having a portion opposite substantially the entire area of a surface of the cover on the opposite side from its surface of contact with the base.

8. A connector according to claim 7 wherein portions of the slider are bent to form a pair of sliding pieces, the sliding pieces being held adjacent the opposite sides of the cover.

9. A connector according to claim 2 wherein the spring housing chamber includes a portion which extends beyond one end of the spring; a lock piece disposed in said extended portion of said chamber; a lug projecting from the lock piece into a lock hole in the slider to prevent the slider from being moved against the biasing force of the spring; said lock piece being so arranged that the lug can be moved out of said lock hole into the spring housing chamber by manipulation from the outside.

10. A connector according to claim 1, wherein said retaining means comprises projecting means formed integrally with said base at one end of its top surface, and engaging means formed integrally with said slider at one end thereof to project in the lengthwise direction of said slider, said engaging means engaging said projecting means when said slider is in engagement with said base to prevent said slider from moving away from said base in a direction perpendicular to the top surface of said base.

11. A connector according to claim 10 wherein said engaging means comprises a pair of engaging pieces formed on both sides of said slider, and said projecting means comprises a pair of projecting pieces formed on both sides of said base for engagement with said engaging pieces.

12. A connector according to claim 10 wherein said retaining means comprises an end piece formed integrally with said slider at the other end thereof and extending in a direction perpendicular to the top surface of said slider to oppose the corresponding end face of said base, a projecting portion formed on said corresponding end face of said base integrally with said base, said projecting portion having an inclined surface sloping down towards the bottom surface of said base, and a recess formed in said end piece to engage said projecting portion when said slider is in engagement with said base.

13. A connector according to claim 1, 4, 7 or 10 comprising a plurality of resilient conductors molded integrally with said base to extend therethrough in parallel to the top surface of said base in a direction perpendicular to the lengthwise direction of said base, the opposing end portions of each of said conductors projecting outwardly of said base, one of the projecting end portions of each of said resilient conductors being folded to the top surface of said base to form one of said contacts and the other projecting end portion being used as a terminal.

14. A connector according to claim 13 wherein a guide groove is formed in said base to extend from each of the points where said conductors projecting outwardly from said base, to corresponding ones of said contact receiving portions, for guiding corresponding ones of said contacts to said corresponding ones of said contact receiving portions.

15. A connector according to claim 1, 4, 7 or 10 wherein intermediate portions of said ribs define a groove which extends in the lengthwise direction of said base to communicate said contact receiving portions with one another; each of said contacts being disposed in a corresponding one of said contact receiving portions so that the highest portion of each said contact from the bottom of its corresponding contact receiving portion is higher than the bottom of said groove but lower than the top of said ribs when said cover is out of engagement with said base; and a projecting hold-down portion formed on the bottom surface of said cover integrally therewith to extend in the lengthwise direction thereof, said hold-down portion being shaped and positioned to fit into said groove when said cover is fixed to said base.

* * * * *